(12) United States Patent
Bao et al.

(10) Patent No.: US 11,380,685 B2
(45) Date of Patent: Jul. 5, 2022

(54) SEMICONDUCTOR DEVICE WITH SUPERLATTICE FIN

(71) Applicant: QUALCOMM Incorporated, San Diego, CA (US)

(72) Inventors: Junjing Bao, San Diego, CA (US); Ye Lu, San Diego, CA (US); Chenjie Tang, San Diego, CA (US); Peijie Feng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/061,941

(22) Filed: Oct. 2, 2020

(65) Prior Publication Data

US 2022/0108983 A1    Apr. 7, 2022

(51) Int. Cl.
| | |
|---|---|
| *H01L 29/66* | (2006.01) |
| *H01L 29/78* | (2006.01) |
| *H01L 29/06* | (2006.01) |
| *H01L 29/10* | (2006.01) |
| *H01L 29/423* | (2006.01) |
| *H01L 27/092* | (2006.01) |

(52) U.S. Cl.
CPC ...... *H01L 27/0924* (2013.01); *H01L 29/0665* (2013.01); *H01L 29/7848* (2013.01)

(58) Field of Classification Search
CPC ....... H01L 21/02603; H01L 21/823431; H01L 21/823821; H01L 21/845; H01L 27/0886; H01L 27/0924; H01L 27/10879; H01L 27/1211; H01L 29/0665; H01L 29/0669; H01L 29/0673; H01L 29/41791; H01L 29/66439; H01L 29/66795; H01L 29/775; H01L 29/7848; H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 2018/0047832 A1* | 2/2018 | Tapily | H01L 29/785 |
| 2018/0090570 A1* | 3/2018 | Peng | H01L 27/0924 |
| 2019/0131415 A1* | 5/2019 | Cheng | H01L 29/78684 |
| 2019/0189769 A1* | 6/2019 | Basker | H01L 29/167 |
| 2020/0395446 A1* | 12/2020 | Yi | H01L 29/0847 |

(Continued)

OTHER PUBLICATIONS

Chang G.K., et al., "Selective Etching of SiGe on SiGe/Si Heterostructures", J. Electrochem. Soc., vol. 138, No. 1, Jan. 1991, pp. 202-204.

(Continued)

*Primary Examiner* — David C Spalla
(74) *Attorney, Agent, or Firm* — Patterson+ Sheridan, L.L.P.

(57) ABSTRACT

Certain aspects of the present disclosure relate to a semiconductor device (e.g., a gate-all-around (GAA) semiconductor device) comprising at least one superlattice fin. One example superlattice fin includes a first plurality of nanosheets composed of a first semiconductor material and a second plurality of nanosheets composed of a second semiconductor material, the second semiconductor material being different from the first semiconductor material, wherein a width of a first nanosheet in the first plurality of nanosheets differs from a width of a second nanosheet in the second plurality of nanosheets, the second nanosheet being adjacent to the first nanosheet.

20 Claims, 9 Drawing Sheets

(56) References Cited

U.S. PATENT DOCUMENTS

| | | | |
|---|---|---|---|
| 2020/0411641 A1* | 12/2020 | Noh | H01L 29/0673 |
| 2021/0098627 A1* | 4/2021 | Liaw | H01L 29/6656 |

OTHER PUBLICATIONS

Wostyn K., et al., "Selective Etch of Si and SiGe for Gate All-Around Device Architecture", ECS Transactions, 69 (8) 147-152 (2015), pp. 147-152.

* cited by examiner (Prior Art)
FIG. 1A (Prior Art)
FIG. 1B (Prior Art)
FIG. 1C

FORM AT LEAST ONE SUPERLATTICE FIN HAVING A FIRST PLURALITY OF NANOSHEETS COMPOSED OF A FIRST SEMICONDUCTOR MATERIAL AND A SECOND PLURALITY OF NANOSHEETS COMPOSED OF A SECOND SEMICONDUCTOR MATERIAL, THE SECOND SEMICONDUCTOR MATERIAL BEING DIFFERENT FROM THE FIRST SEMICONDUCTOR MATERIAL, WHEREIN A WIDTH OF A FIRST NANOSHEET IN THE FIRST PLURALITY OF NANOSHEETS DIFFERS FROM A WIDTH OF A SECOND NANOSHEET IN THE SECOND PLURALITY OF NANOSHEETS, THE SECOND NANOSHEET BEING ADJACENT TO THE FIRST NANOSHEET

FIG. 6

SEMICONDUCTOR DEVICE WITH SUPERLATTICE FIN

TECHNICAL FIELD

Certain aspects of the present disclosure relate to electronic components and, more particularly, to a semiconductor device including at least one superlattice fin.

BACKGROUND

Advances in technology have resulted in smaller and more powerful computing devices. For example, a variety of portable personal computing devices—including wireless telephones such as mobile and smart phones, tablets, and laptop computers—are small, lightweight, and easily carried by users. These devices can communicate voice and data packets over wireless networks. Further, many such devices incorporate additional functionality such as a digital still camera, a digital video camera, a digital recorder, and an audio file player. Additionally, such devices can process executable instructions, including software applications, such as a web browser application, that can be used to access the Internet. As such, these devices can include significant computing capabilities.

Computing devices use a large number of integrated circuits (ICs), such as transistors that may be used for processing logic and transistors used for memory devices. As computing devices continue to decrease in size and to increase in capabilities, the footprint associated with transistors in various ICs tends to increase, relative to the size of the computing devices, unless the size of each transistor can be decreased. Fin field-effect transistor (FinFET) technology has been introduced to overcome this seeming footprint limitation. FinFETs are a type of metal-oxide-semiconductor FET (MOSFET) in which a gate structure is placed on two, three, or four sides of a channel structure, allowing for significantly faster switching times and higher current density than planar MOSFET technology. However, FinFET technology is facing critical scaling issues for three nanometer technology and below. Thus, multi-bridge-channel FET (MBCFET) technology, having vertically stacked nanosheets and a gate-all-around (GAA) structure, has been developed to replace FinFETs in certain applications.

SUMMARY

Certain aspects of the present disclosure relate to semiconductor devices (e.g., gate-all-around (GAA) integrated circuits) comprising at least one superlattice fin. For certain aspects, the at least one superlattice fin may comprise a first plurality of nanosheets and a second plurality of nanosheets. In some cases, a width of nanosheets in the first plurality of nanosheets may differ from a width of nanosheets in the second plurality of nanosheets.

Certain aspects of the present disclosure are directed to a semiconductor device comprising at least one superlattice fin. The at least one superlattice fin includes a first plurality of nanosheets composed of a first semiconductor material and a second plurality of nanosheets composed of a second semiconductor material, the second semiconductor material being different from the first semiconductor material, wherein a width of a first nanosheet in the first plurality of nanosheets differs from a width of a second nanosheet in the second plurality of nanosheets, the second nanosheet being adjacent to the first nanosheet.

Certain aspects of the present disclosure relate to a method for fabricating a semiconductor device. The method includes forming at least one superlattice fin having a first plurality of nanosheets composed of a first semiconductor material and a second plurality of nanosheets composed of a second semiconductor material, the second semiconductor material being different from the first semiconductor material, wherein a width of a first nanosheet in the first plurality of nanosheets differs from a width of a second nanosheet in the second plurality of nanosheets, the second nanosheet being adjacent to the first nanosheet.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are directed to a semiconductor device (e.g., a gate-all-around (GAA) semiconductor device) comprising at least one superlattice fin. The semiconductor device includes a plurality of nanosheet stack structures disposed vertically above a horizontal plane of a substrate. In some cases, the nanosheet stack structures may include a first plurality of nanosheets and a second plurality of nanosheets. In some cases, the first plurality of nanosheets may be composed of a first semiconductor material, while the second plurality of nanosheets may be composed of a second semiconductor material. Additionally, in an effort to achieve a balanced current density within the superlattice fin, widths of nanosheets in the first plurality of nanosheets may differ from widths of nanosheets in the second first plurality of nanosheets.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Certain terminology may also be used in the following description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent, but arbitrary frame of reference which is made clear by reference to the text and the associated drawings describing the component under discussion. Such terminology may include the words specifically mentioned above, derivatives thereof, and words of similar import.

Example FinFET and GAA Semiconductor Devices

Figure 1A:
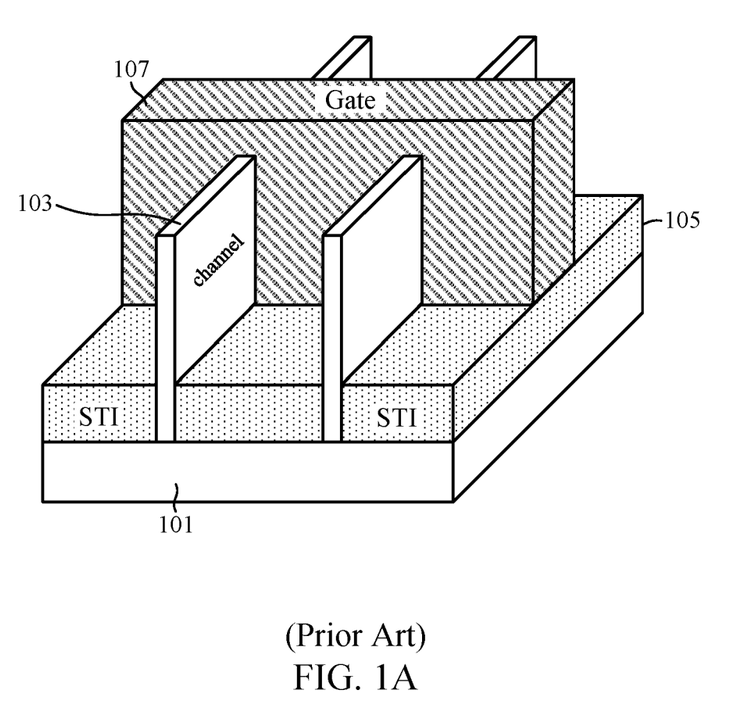
FIG. 1A illustrates a perspective view of a conventional fin field-effect transistor (FinFET) semiconductor device.

FIG. 1A illustrates an example fin field-effect transistor (FinFET). A FinFET is a type of non-planar or three-dimensional transistor that includes a channel structure that rises above the substrate 101 and resembles a fin 103. As illustrated, a shallow trench isolation (STI) structure 105 may be included to provide isolation between each fin 103. The fin 103 provides the semiconductor channel of the transistor between source and drain regions and is surrounded on three sides by a gate region 107, providing more control over the channel as compared to traditional planar transistor designs. However, as transistors continue to scale down, FinFET technology is met with difficulties. For example, as FinFET transistors scale down, an effective width of the channel (e.g., fins) decreases, leading to performance loss. In order to address this performance loss, one solution involves increasing the effective width of the channel. However, increasing the effective width of the channel decreases the transistor density (i.e., the number of transistors that may fit in a given area). In other words, with a larger channel width, less number of cells can fit in the given area.

Thus, in order to increase density and performance, multi-bridge-channel field-effect transistor (MBCFET) technology has been developed to replace FinFETs in certain applications (e.g., in sub-3-nm transistor technology). MBCFETs include a number of vertically stacked nanosheet structures with a gate-all-around (GAA) structure, which may provide superior direct current (DC) performance and better short channel control compared to FinFETs due to better electrostatics by gate all around.

Figure 1B:
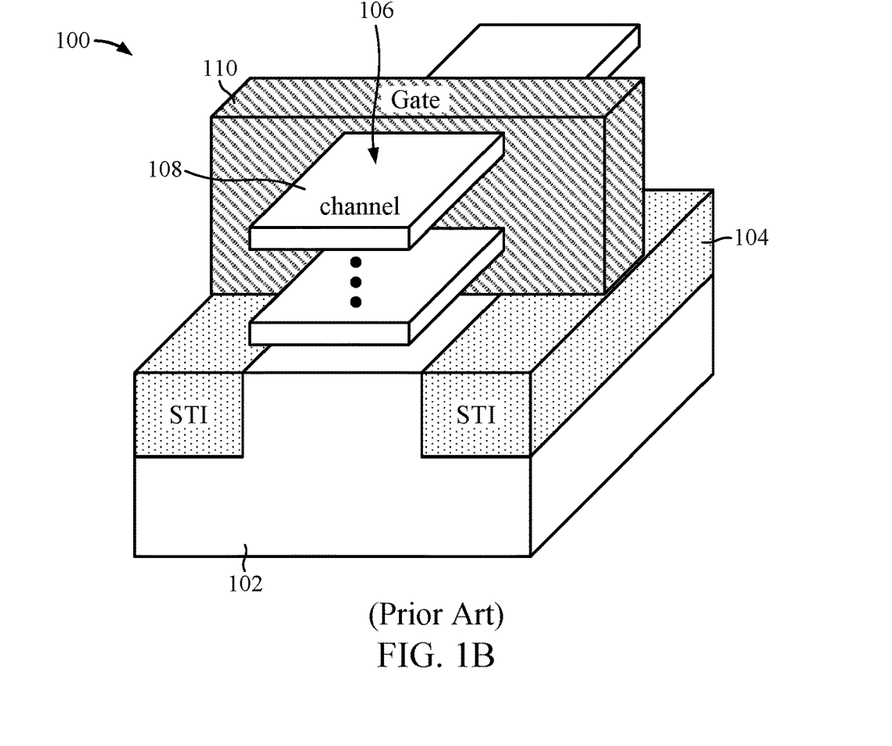
FIGS. 1B and 1C illustrate a perspective view and a cross-section, respectively, of a conventional gate-all-around (GAA) semiconductor device.
Figure 1C:
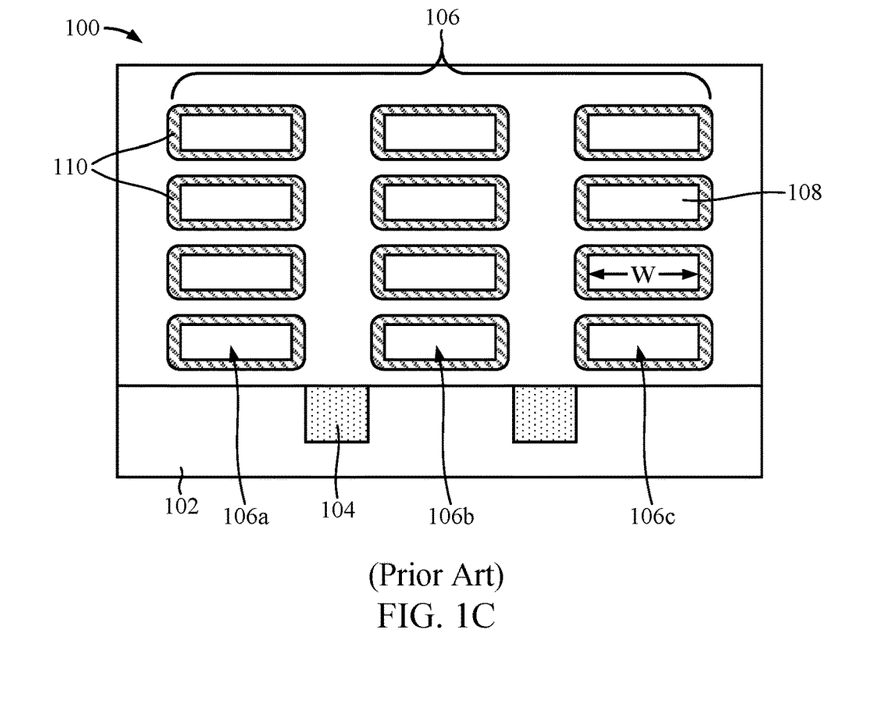

FIGS. 1B and 1C illustrate a perspective view and a cross-section, respectively, of an example GAA semiconductor device 100. More specifically, FIG. 1C illustrates a transverse cross-section through the longitudinal axis of the gate structure of FIG. 1B. As illustrated, the GAA semiconductor device 100 may comprise a substrate layer 102. The substrate layer 102 may be a substrate employed in a semiconductor process, such as a silicon (Si) substrate or any other suitable material (e.g., glass, ceramic, aluminum oxide ($Al_2O_3$), etc.). FIG. 1C illustrates the cross-section of the substrate layer 102 as a plain rectangle in order to simplify the illustration, and is not intended to be limiting. For example, there may be other shapes and sizes of the substrate layer 102, as well as intervening layers.

Additionally, as illustrated, the GAA semiconductor device 100 may include a plurality of nanosheet stack structures 106, each comprising a plurality of nanosheets 108 (or nanowires) stacked vertically above the substrate layer 102. It should be noted that FIG. 1B only illustrates a single nanosheet stack structure 106 (with two or more nanosheet channels) for ease of understanding. However, the GAA semiconductor device 100 may include any number of nanosheet stack structures, such as the three-nanosheet stack structures illustrated in FIG. 1C.

In some cases, each of the nanosheet stack structures 106 may serve different functions and correspond to a different type of transistor device. For example, in some cases, nanosheet stack structure 106a may correspond to a pull-up transistor, nanosheet stack structure 106b may correspond to a pass-gate transistor, and nanosheet stack structure 106c may correspond to a pull-down transistor of a static random-access memory (SRAM) cell. Further, as illustrated, a shallow trench isolation (STI) structure 104 may be included within the substrate to provide isolation between different transistor devices.

Each of the nanosheets 108 may be composed of the same semiconductor material, such as silicon (Si), and form a channel between source and drain terminals through which electrical current may flow. In order to control the electrical current flow through the channel, the nanosheets 108 may be wrapped in a high dielectric constant ($\kappa$) metal gate (HKMG) structure 110. The HKMG structure 110 may function as a gate terminal and be used to bias the semiconductor material of the channel to control the current flow.

In certain cases, the effective width (labeled "W") of the nanosheets 108, or "channel width," may be varied, allowing for density and performance of the GAA semiconductor device 100 to be tuned. For example, in some cases, the effective width of the nanosheets 108 may be reduced (e.g., narrow), allowing more MBCFETs to fit in a given area of the GAA semiconductor device 100 (i.e., higher density). In other cases, the effective width of the nanosheets 108 may be increased (e.g., wide), providing the GAA semiconductor device 100 with higher performance.

As noted above, MBCFETs, such as the GAA semiconductor device 100, may have superior DC performance and better short channel control compared to FinFETs due to the uniform channel thickness, the larger effective channel width, and the GAA structure (e.g., HKMG structure 110). The wide range of variable nanosheet widths, as opposed to the discrete number of fins for FinFET technology, may also provide greater design flexibility for MBCFETs.

However, while the GAA semiconductor device 100 may have superior DC performance and better short channel control, the GAA semiconductor device 100 may not be advantageous in certain scenarios, such as being used as an input/output (I/O) device. For example, I/O devices are devices that handle input and/or output voltage/current levels, and as such, these devices may be designed to tolerate a greater amount of voltage or current swing than non-I/O devices (e.g., core devices). However, due to the relatively narrow spacing between nanosheets 108 of the GAA semiconductor device 100, the GAA semiconductor device 100 may not be able to accommodate a layer of oxide or other insulator between the nanosheets of sufficient thickness to increase the breakdown voltage and provide for handling such voltage and/or current swings.

Figure 2:
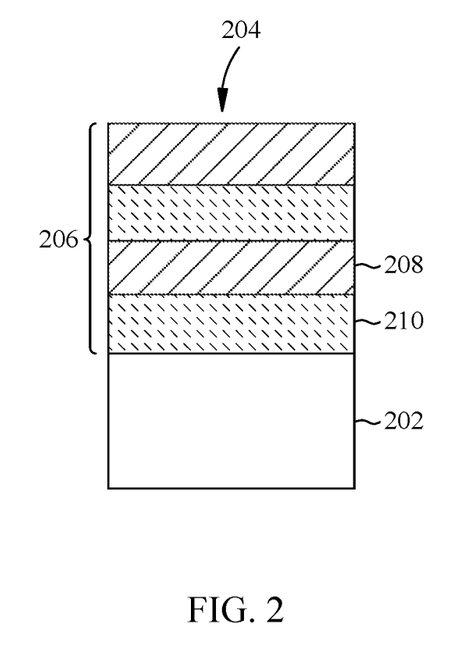
FIG. 2 illustrates a cross-section of an example superlattice fin.

Accordingly, to still achieve the benefits of superior DC performance and better short channel control associated with GAA semiconductor device while allowing such devices to handle the voltage/current demands of typical I/O devices, one type of semiconductor device includes a superlattice structure, referred to herein as a superlattice fin. An example superlattice fin 200 (e.g., of a superlattice fin FET) is illustrated in FIG. 2.

As shown, the superlattice fin 200 may generally have the same structure as one of the nanosheet stack structures 106 of the GAA semiconductor device 100 shown in FIGS. 1B-1C, except that the superlattice fin 200 includes a nanosheet stack structure of nanosheets of alternating semiconductor materials, referred to as a "superlattice." For example, as illustrated, the superlattice fin 200 may include a substrate 202 and a nanosheet stack structure 204 that includes a plurality of nanosheets 206 of alternating semiconductor materials. For example, as shown, the nanosheet stack structure 204 may include a first set of nanosheets 208 of a first semiconductor material, such as silicon (Si), and a second set of nanosheets 210 of a second semiconductor material, such as silicon germanium (SiGe). By alternating the nanosheets 208 and nanosheets 210, the superlattice fin FET may be able to appropriately handle the voltage/current swings associated with I/O devices (e.g., without device failure).

As an example, the core devices of a GAA integrated circuit (IC) may be constructed as GAA FETs, but the I/O transistors of the GAA IC may be constructed as superlattice fin FETs. The superlattice fin I/O transistors may be located in the periphery of the GAA IC, for example. Such superlattice fin FETs may not be considered as GAA devices, per se, even though these superlattice transistors are formed on the same substrate as the core GAA FETs.

In certain cases, depending on a type of the superlattice fin FET (e.g., n-type versus p-type), current flowing through the superlattice fin FET may be concentrated in either the nanosheets 208 (e.g., silicon) or the nanosheets 210 (e.g., silicon germanium), which may cause these nanosheets to fail. For example, for n-type metal-oxide-semiconductor (NMOS) devices, current may be concentrated in the silicon nanosheets since there may be higher electron mobility in silicon rather than silicon germanium, which may cause the silicon nanosheets to fail. Conversely, for p-type metal-oxide-semiconductor (PMOS) devices, current may be concentrated in the silicon germanium nanosheets since the threshold voltage ($V_t$) is lower for silicon germanium as compared to silicon, which may cause the silicon germanium nanosheets to fail.

Thus, aspects of the present disclosure provide techniques for reducing the current concentration in one set of nanosheets by balancing the current density across the different sets of nanosheets within a superlattice fin FET. For example, in some cases, techniques presented herein involve differing the widths of the nanosheets within the superlattice fin FET depending on the semiconductor material of the nanosheets. For example, in some cases, the superlattice fin FET may include a first plurality of nanosheets composed of a first semiconductor material and a second plurality of nanosheets composed of a second semiconductor material, where a width of a first nanosheet in the first plurality of nanosheets may differ from a width of a second nanosheet in the second plurality of nanosheets.

Example Superlattice Fin Transistor with Balanced Current

Figure 3A:
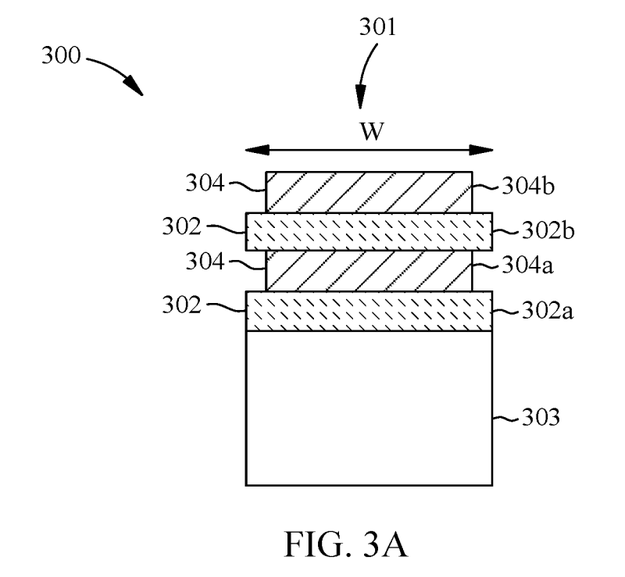
FIGS. 3A-3B illustrate example cross-sections of a semiconductor device comprising at least one superlattice fin, according to certain aspects presented herein.
Figure 3B:
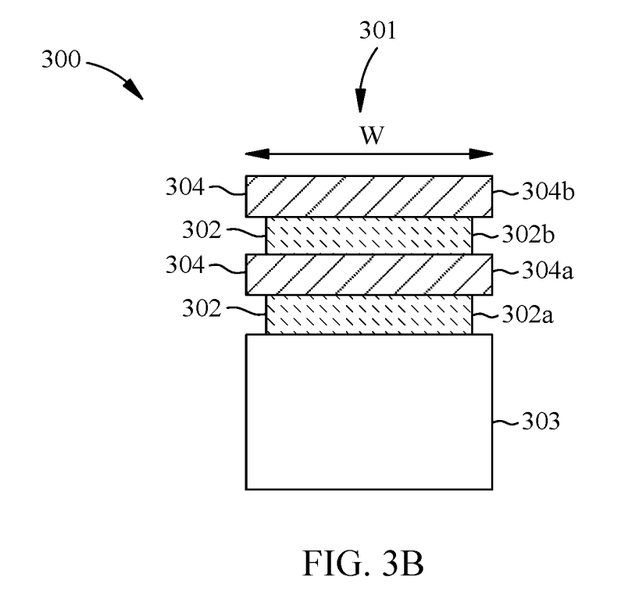

FIGS. 3A-3B illustrate example cross-sections of a semiconductor device 300 comprising at least one superlattice fin 301, according to certain aspects presented herein. Generally, the superlattice fin 301 may be implemented in different types of transistors. For example, the superlattice fin 301 illustrated in FIG. 3A may be part of an n-type field-effect transistor (NFET), while the superlattice fin 301 illustrated in FIG. 3B may be part of a p-type field-effect transistor (PFET). In either case, the superlattice fin 301 illustrated in FIGS. 3A-3B may include a first plurality of nanosheets 302 and a second plurality of nanosheets 304 disposed above a substrate 303. While the superlattice fin 301 is illustrated to include four nanosheets, it should be understood that the superlattice fin 301 may include any number of nanosheets.

The substrate 303 may be composed of a material such as glass, ceramic, aluminum oxide ($Al_2O_3$), or the like. In some cases, the first plurality of nanosheets 302 may be composed of a first semiconductor material, such as silicon germanium (SiGe), while the second plurality of nanosheets 304 may be composed of a second semiconductor material, such as silicon (Si).

According to aspects, to help balance a current density within the superlattice fin 301 and reduce the likelihood that one or more nanosheets of the first plurality of nanosheets 302 or second plurality of nanosheets 304 fail, the superlattice fin 301 may be fabricated such that a width of nanosheets within the first plurality of nanosheets 302 differs from a width of nanosheets in the second plurality of nanosheets 304.

For example, when the superlattice fin 301 is part of an NFET, the width of a first nanosheet 302a of the first plurality of nanosheets 302 may be greater than a width of a second nanosheet 304a of the second plurality of nanosheets 304. Stated otherwise, in some cases, the width of the second nanosheet 304a may be less than the width of the first nanosheet 302a, as illustrated in FIG. 3A. Similarly, when the superlattice fin 301 is part of a PFET, the width of the second nanosheet 304a may be greater than the width of the first nanosheet 302a, as depicted in FIG. 3B.

Further, as illustrated in FIG. 3A, the second nanosheet 304a may be disposed above and adjacent to the first nanosheet 302a. Additionally, as shown, a third nanosheet 302b in the first plurality of nanosheets 302 may be disposed above the second nanosheet 304a, and a fourth nanosheet 304b in the second plurality of nanosheets 304 may be disposed above and adjacent to the third nanosheet 302b. Further, as illustrated, a width of the fourth nanosheet 304b may be less than a width of the third nanosheet 302b. Additionally, as illustrated, the width of the first nanosheet 302a may be substantially the same as the width of the third nanosheet 302b, and the width of the second nanosheet 304a may be substantially the same as the width of the fourth nanosheet 304b.

Accordingly, when the superlattice fin 301 is part of an NFET, by fabricating the second nanosheet 304a and fourth nanosheet 304b with widths that are less than the widths of the first nanosheet 302a and the third nanosheet 302b, a density of a current flowing through the superlattice fin 301 in FIG. 3A (e.g., during input/output operations) may be balanced or averaged across all of the nanosheets within the superlattice fin 301 (e.g., nanosheets 302a, 302b, 304a, and 304b), avoiding concentration of the current within any particular nanosheet or nanosheet type that could lead to failure.

For example, by reducing the width of the second nanosheet 304a and fourth nanosheet 304b (e.g., which may be composed of silicon) relative to the first nanosheet 302a and the third nanosheet 302b (e.g., which may be composed of silicon germanium), an effective resistance of the silicon in the second nanosheet 304a and the fourth nanosheet 304b will be substantially the same as the effective resistance of the silicon germanium in the first nanosheet 302a and the third nanosheet 302b, balancing the current between the first plurality of nanosheets 302 and the second plurality of nanosheets 304. In some cases, to achieve a balanced current across all of the nanosheets within the superlattice fin 301 of an NFET, a width of the second plurality of nanosheets 304 composed of silicon may be in the range of 0.286× to 1× the width of the first plurality of nanosheets 302 composed of silicon germanium.

Similarly, as illustrated in FIG. 3B, the second nanosheet 304a may be disposed above and adjacent to the first nanosheet 302a. Additionally, as shown, a third nanosheet 302b in the first plurality of nanosheets 302 may be disposed above the second nanosheet 304a, and a fourth nanosheet 304b in the second plurality of nanosheets 304 may be disposed above and adjacent to the third nanosheet 302b. Further, as illustrated, a width of the fourth nanosheet 304b may be greater than a width of the third nanosheet 302b. Additionally, as illustrated, the width of the first nanosheet 302a may be substantially the same as the width of the third nanosheet 302b, and the width of the second nanosheet 304a may be substantially the same as the width of the fourth nanosheet 304b.

Accordingly, when the superlattice fin 301 is part of a PFET, by fabricating the second nanosheet 304a and the fourth nanosheet 304b with widths that are greater than the widths of the first nanosheet 302a and the third nanosheet 302b, a density of a current flowing through the superlattice fin 301 in FIG. 3B (e.g., during input/output operations) may be balanced or averaged across all of the nanosheets within the superlattice fin 301 (e.g., nanosheets 302a, 302b, 304a, and 304b), avoiding concentration of the current within any particular nanosheet or nanosheet type that could lead to failure.

For example, by reducing the width of the first nanosheet 302a and the third nanosheet 302b (e.g., which may be composed of silicon germanium) relative to the second nanosheet 304a and the fourth nanosheet 304b (e.g., which may be composed of silicon), an effective resistance of the silicon in the second nanosheet 304a and the fourth nanosheet 304b will be substantially the same as the effective resistance of the silicon germanium in the first nanosheet 302a and the third nanosheet 302b, balancing the current between the first plurality of nanosheets 302 and the second plurality of nanosheets 304. In some cases, to achieve a balanced current across the nanosheets within the superlattice fin 301 of a PFET, a width of the first plurality of nanosheets 302 composed of silicon germanium may be in the range of 0.37× to 1× the width of the second plurality of nanosheets 304 composed of silicon.

In some cases, to further improve the current balancing between the first plurality of nanosheets 302 and second plurality of nanosheets 304, a different structure of the superlattice fin 301 may be used than that shown in FIGS. 3A-3B. For example, in some cases, a trapezoidal-shaped structure may be employed in which the widths of the first plurality of nanosheets 302 and second plurality of nanosheets 304 may depend on a distance from the substrate 303 of the superlattice fin 301. Trapezoidal structures provide better short channel effect due to smaller fin width and higher AC performance due to lower capacitance.

Figure 4A:
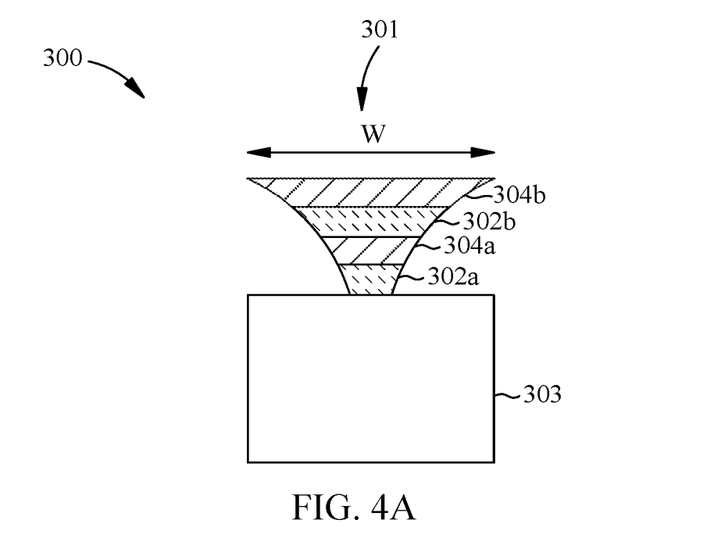
FIGS. 4A-4B illustrate example cross-sections of a semiconductor device comprising at least one superlattice fin with a trapezoidal structure, according to certain aspects presented herein.

For example, as illustrated in FIG. 4A, when the superlattice fin 301 is part of a PFET, a downward-facing trapezoidal-shaped structure may be employed in which widths of nanosheets in at least one of the first plurality of nanosheets 302 or the second plurality of nanosheets 304 may increase with distance away from the substrate. In other words, the further away a nanosheet is away from the substrate 303, the greater its width may be. For example, as illustrated in FIG. 4A, the width of the second nanosheet 304a may be greater than the width of the first nanosheet 302a since the second nanosheet 304a is further away from the substrate 303 than the first nanosheet 302a. Likewise, the width of the third nanosheet 302b may be larger than the width of the second nanosheet 204a, while the width of the fourth nanosheet 304b may be greater than the width of the third nanosheet 302b.

Figure 4B:
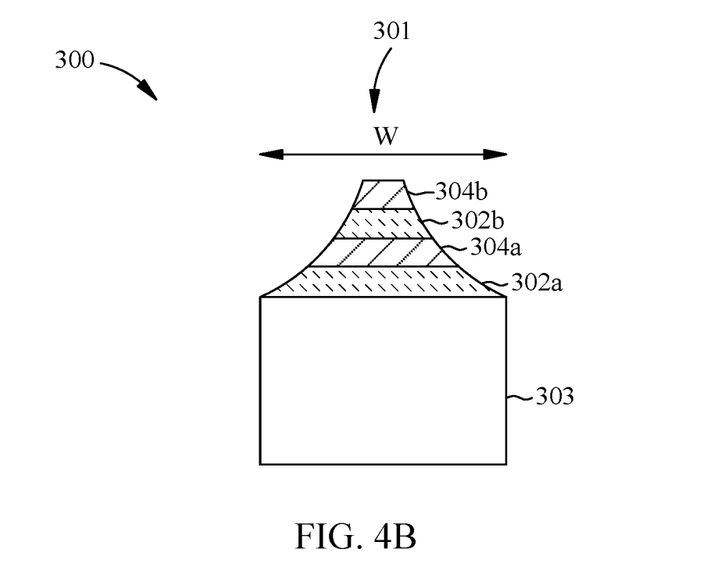

In contrast, as illustrated in FIG. 4B, when the superlattice fin 301 is part of an NFET, an upward-facing trapezoidal-shaped structure may be employed in which widths of nanosheets in at least one of the first plurality of nanosheets 302 or the second plurality of nanosheets 304 may decrease with distance away from the substrate. In other words, the further away a nanosheet is to the substrate 303, the lower its width may be. For example, as illustrated in FIG. 4B, the width of the second nanosheet 304a may be less than the width of the first nanosheet 302a since the second nanosheet 304a is further away from the substrate 303 than the first nanosheet 302a. Likewise, the width of the third nanosheet 302b may be shorter than the width of the second nanosheet 204a, while the width of the fourth nanosheet 304b may be shorter than the width of the third nanosheet 302b.

In some cases, more than one superlattice fin may be employed in a semiconductor device (e.g., a GAA semiconductor device). For example, in some cases, the semiconductor device may include a first superlattice fin and a second superlattice fin. In some cases, the first superlattice fin and the second superlattice fin may be part of different types of transistors. For example, in some cases, the first superlattice fin is part of an NFET, while the second superlattice fin may be part of a PFET. Accordingly, in some cases, the first plurality of nanosheets 302 in the first superlattice fin may have a greater width than the second plurality of nanosheets 304 in the first superlattice fin (e.g., as illustrated in FIG. 3A), while the first plurality of nanosheets 302 in the second superlattice fin have a smaller width than the second plurality of nanosheets 304 in the second superlattice fin (e.g., as illustrated in FIG. 3B).

Figure 5A:
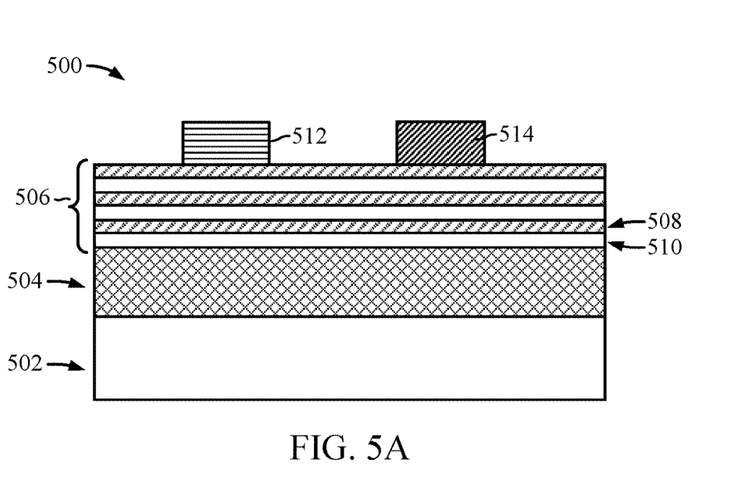
FIGS. 5A-I illustrate example operations for fabricating a semiconductor device comprising at least one superlattice fin, in accordance with certain aspects of the present disclosure.

FIGS. 5A-5I illustrate example operations for fabricating a semiconductor device (e.g., a GAA IC) comprising at least one superlattice fin, such as the semiconductor device 300, in accordance with certain aspects of the present disclosure. As illustrated in FIG. 5A, the operations may begin by forming a substrate layer 502 and depositing an oxide layer 504 on the substrate layer 502. In some cases, the substrate layer 502 may comprise any suitable semiconductor material, such as silicon. Additionally, the oxide layer 504 may comprise any suitable oxide material, such as silicon dioxide. An epitaxial structure 506 may then be epitaxially grown above the oxide layer 504. As illustrated, the epitaxial structure 506 may comprise a plurality of alternating layers 508 and 510, which will later become the one or more nanosheets of the semiconductor device 300. In some cases, the layers 508 may comprise a semiconductor material, such as silicon (Si). Additionally, in some cases, the layers 510 may comprise a different semiconductor material, such as germanium (Ge) or silicon germanium (SiGe).

According to aspects, as illustrated in FIG. 5A, a first photo-resist mask 512 may be deposited on the epitaxial structure 506. The first photo-resist mask 512 may be deposited on a location of the epitaxial structure 506 that corresponds (or will correspond) to a first transistor device/ nanosheet stack structure, such as a PFET input/output device. Additionally, as shown, a second photo-resist mask 514 may be deposited on the epitaxial structure 506. The second photo-resist mask 514 may be deposited on a location of the epitaxial structure 506 that corresponds (or will correspond) to a second transistor device/nanosheet stack structure, such as an NFET input/output device.

Figure 5B:
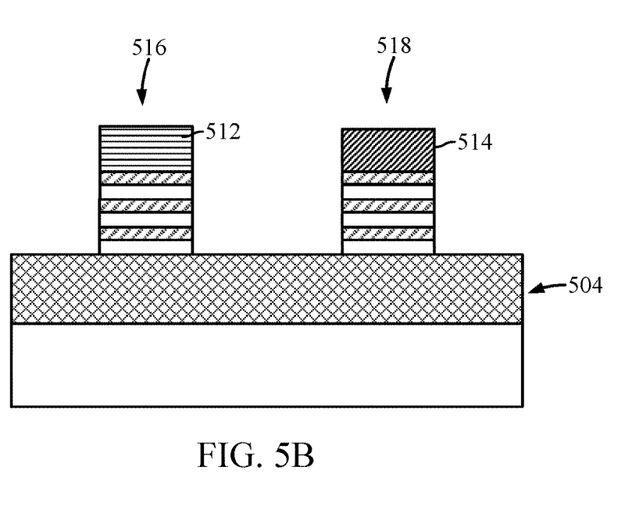

As illustrated in FIG. 5B, the alternating layers 508 and 510 may then be removed (e.g., etched) from unprotected areas (e.g., areas not underneath first photo-resist mask 512 or the second photo-resist mask 514) of the epitaxial structure 506 down to the oxide layer 504, forming two nanosheet stack structures 516 and 518. As shown, the nanosheet stack structures 516 and 518 may include the alternating layers 508 and 510 (e.g., composed of Ge/SiGe and Si, respectively), forming a superlattice structure.

Figure 5C:
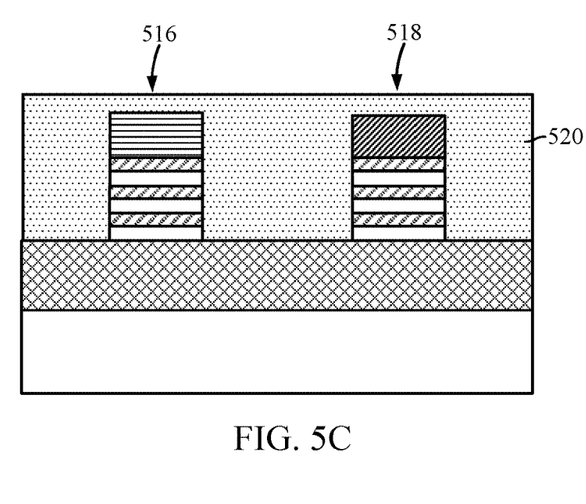

Thereafter, as illustrated in FIG. 5C, a polycrystalline silicon layer 520 may be deposited on top of the oxide layer 504 and surrounding the nanosheet stack structures 516 and 518.

Figure 5D:
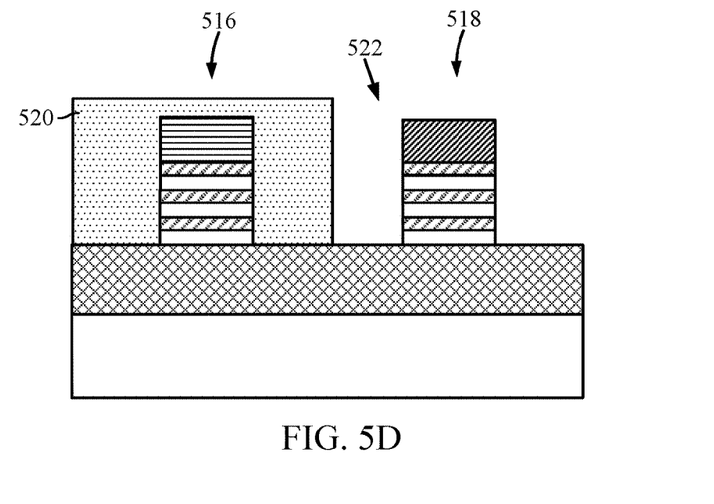

Next, as illustrated in FIG. 5D, a portion 522 of the polycrystalline silicon layer 520 may be removed (e.g., etched) around the nanosheet stack structure 518, leaving only the nanosheet stack structure 516 surrounded by the polycrystalline silicon layer 520.

Figure 5E:
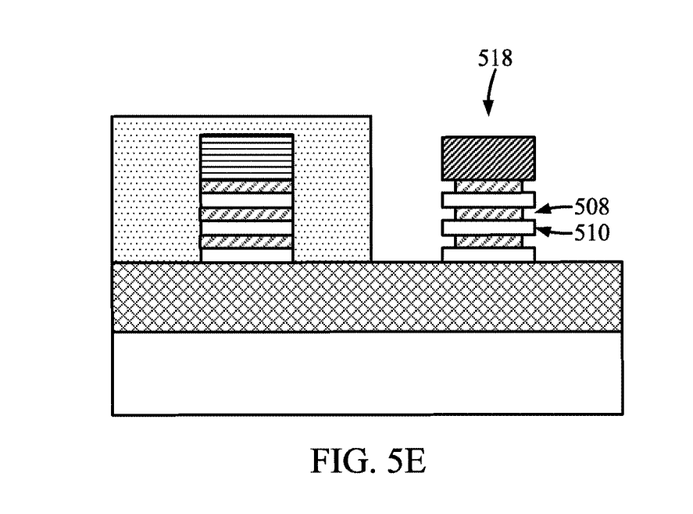

Thereafter, as illustrated in FIG. 5E, the layers 508 of the nanosheet stack structure 518 may be selectively etched, reducing a width of the layers 508 (e.g., Si) relative to the layers 510 (e.g., Ge/SiGe). In some cases, the layers 508 may be selectively etched using hydrofluoric acid, hydrogen peroxide, and/or acetic acid ($HF:H_2O_2:CH_3COOH$).

Figure 5F:
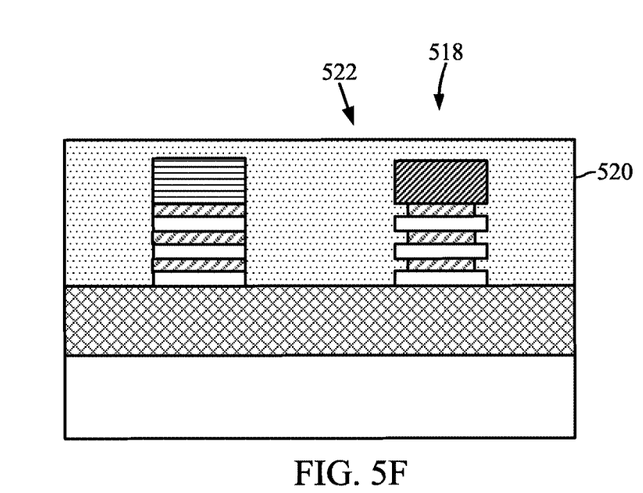

As illustrated in FIG. 5F, the polycrystalline silicon layer 520 may then be deposited in the portion 522, once again surrounding the nanosheet stack structure 518.

Figure 5G:
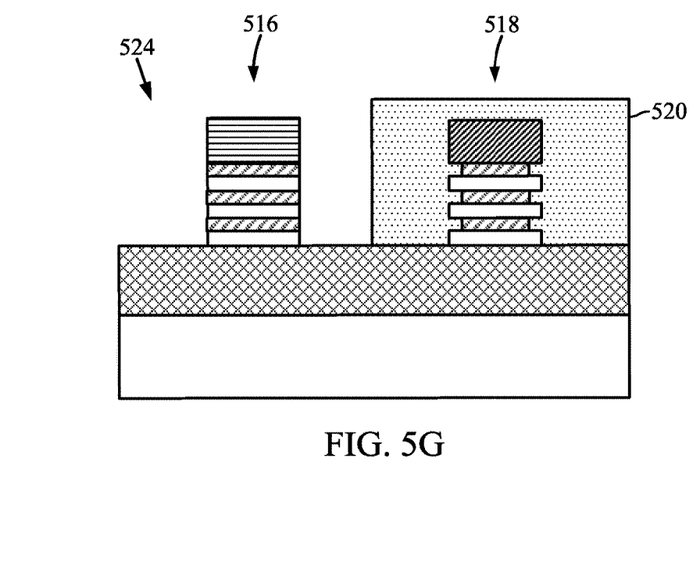

Thereafter, as illustrated in FIG. 5G, a portion 524 of the polycrystalline silicon layer 520 may be removed (e.g., etched) around the nanosheet stack structure 516, leaving only the nanosheet stack structure 518 surrounded by the polycrystalline silicon layer 520.

Figure 5H:
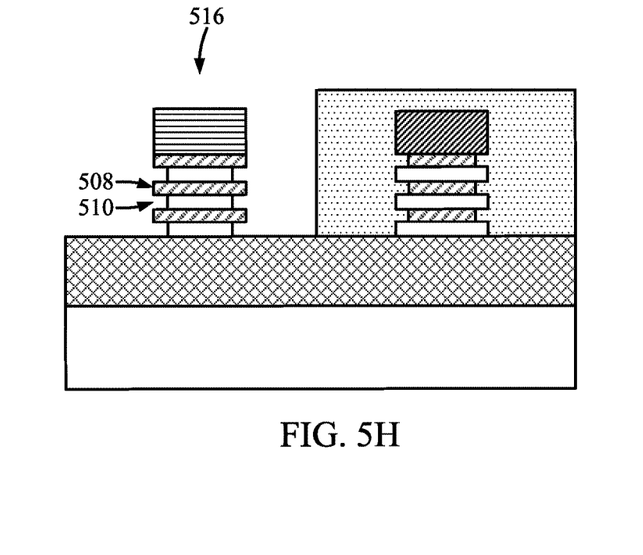

Afterwards, as illustrated in FIG. 5H, the layers 510 of the nanosheet stack structure 516 may be selectively etched, reducing a width of the layers 510 (e.g., Ge/SiGe) relative to the layers 508 (e.g., Si). In some cases, the layers 510 may be selectively etched using tetramethyl ammonium hydroxide ($C_4H_{13}NO$).

Figure 5I:
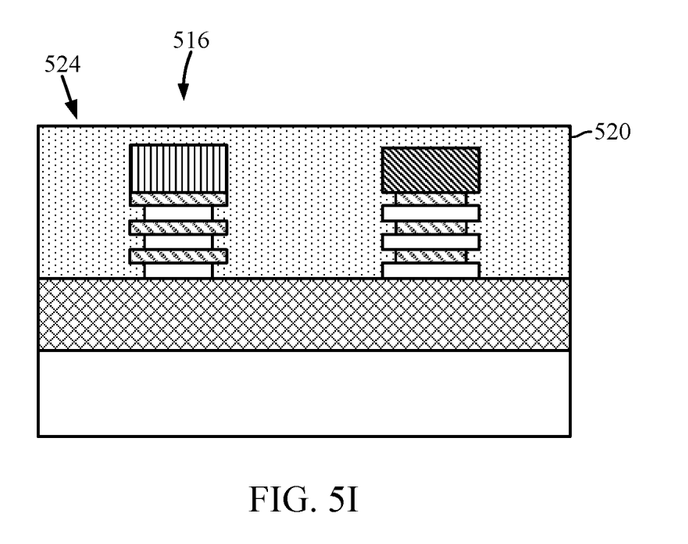

Thereafter, as illustrated in FIG. 5I, the polycrystalline silicon layer 520 may be deposited in the portion 524, once again surrounding the nanosheet stack structure 516.

Figure 6:
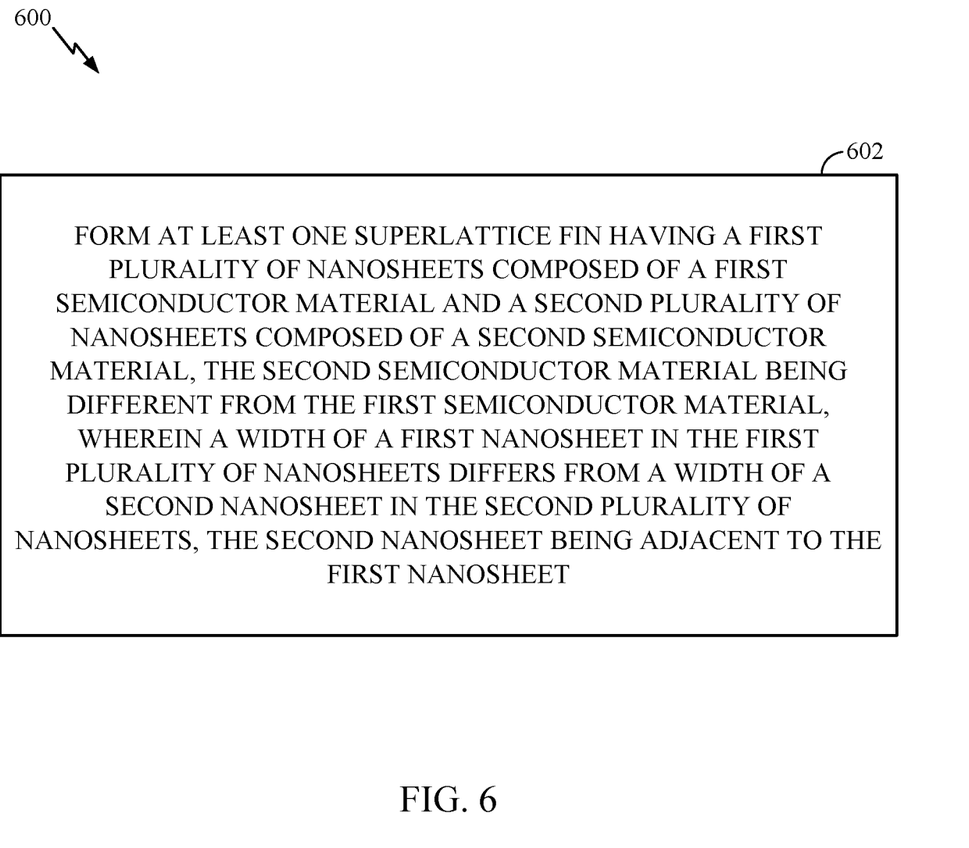
FIG. 6 is a flow diagram illustrating example operations for fabricating a semiconductor device comprising at least one superlattice fin, in accordance with certain aspects of the present disclosure.

FIG. 6 is a flow diagram illustrating example operations 600 for fabricating a semiconductor device (e.g., a GAA semiconductor device) comprising at least one superlattice fin, such as the semiconductor device 300, in accordance with certain aspects of the present disclosure. The operations 600 may be performed, for example, by a semiconductor processing facility (e.g., a fab house).

The operations 600 begin, at block 602, with the semiconductor processing facility forming at least one superlattice fin. The superlattice fin has a first plurality of nanosheets composed of a first semiconductor material and a second plurality of nanosheets composed of a second semiconductor material, where the second semiconductor material is different from the first semiconductor material. For example, the first semiconductor material may comprise silicon germanium (SiGe), whereas the second semiconductor material may comprise silicon (Si). A width of a first nanosheet in the first plurality of nanosheets differs from a width of a second nanosheet in the second plurality of nanosheets, the second nanosheet being adjacent to the first nanosheet.

In some cases, forming the at least one superlattice fin at block 602 may comprise selectively etching at least one of the first semiconductor material or the second semiconductor material, such that the width of the first nanosheet differs from the width of the second nanosheet.

Additionally, in some cases, the at least one superlattice fin is part of an n-type field-effect transistor (NFET), and the width of the second nanosheet is less than the width of the first nanosheet. Accordingly, in such cases, forming the at least one superlattice fin at block 602 may comprise forming the second nanosheet above and adjacent to the first nanosheet, forming a third nanosheet in the first plurality of nanosheets above and adjacent to the second nanosheet, and forming a fourth nanosheet in the second plurality of nanosheets above and adjacent to the third nanosheet. A width of the fourth nanosheet may be less than a width of the third nanosheet. In certain aspects, the width of the first nanosheet is substantially the same as the width of the third nanosheet, and/or the width of the second nanosheet is substantially the same as the width of the fourth nanosheet. In other aspects, the width of the fourth nanosheet is less than the width of the third nanosheet and/or the width of the third nanosheet is less than the width of the second nanosheet. In some cases, the width of the second nanosheet is at least 0.286 times the width of the first nanosheet, but less than the width of the first nanosheet.

According to certain aspects, the at least one superlattice fin is part of a p-type field-effect transistor (PFET), and the width of the second nanosheet is greater than a width of the first nanosheet. Accordingly, in such cases, forming the at least one superlattice fin at block 602 may comprise forming the second nanosheet above and adjacent to the first nanosheet, forming a third nanosheet in the first plurality of nanosheets above and adjacent to the second nanosheet, and forming a fourth nanosheet in the second plurality of nanosheets above and adjacent to the third nanosheet. In certain aspects, a width of the fourth nanosheet is less than a width of the third nanosheet. In some cases, the width of the first nanosheet may be substantially the same as the width of the third nanosheet, and/or the width of the second nanosheet may be substantially the same as the width of the fourth nanosheet. In other cases, the width of the fourth nanosheet may be greater than the width of the third nanosheet, and the width of the third nanosheet may be greater than the width of the second nanosheet. In some cases, the width of the first nanosheet is at least 0.37 times the width of the second nanosheet, but less than the width of the second nanosheet.

According to certain aspects, the at least one superlattice fin structure is part of an input/output (I/O) transistor for the semiconductor device. For example, the semiconductor device may comprise a GAA semiconductor device having a plurality of core GAA transistors, and the at least one superlattice fin structure is part of an I/O transistor for the GAA semiconductor device.

In some cases, widths of nanosheets in the first plurality of nanosheets may be substantially the same, and/or widths of nanosheets in the second plurality of nanosheets may be substantially the same.

According to certain aspects, the at least one superlattice fin may be formed above a substrate, such that the substrate is disposed beneath the first and second pluralities of nanosheets. In some cases, widths of nanosheets in at least one of the first plurality of nanosheets or the second plurality of nanosheets may increase with distance away from the substrate. In other cases, widths of nanosheets in at least one of the first plurality of nanosheets or the second plurality of nanosheets may decrease with distance away from the substrate.

For certain aspects, an effective resistance of the first nanosheet in the first plurality of nanosheets is substantially the same as an effective resistance of the second nanosheet in the second plurality of nanosheets.

Additionally, in some cases, forming the at least one superlattice fin at block 602 may involve forming a first superlattice fin and forming a second superlattice fin. In some cases, the first superlattice fin is part of an n-type field-effect transistor (NFET), and the second superlattice fin is part of a p-type field-effect transistor (PFET). In some cases, the first plurality of nanosheets in the first superlattice fin have a greater width than the second plurality of nanosheets in the first superlattice fin. Additionally, in some cases, the first plurality of nanosheets in the second superlattice fin have a smaller width than the second plurality of nanosheets in the second superlattice fin.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A semiconductor device comprising at least one superlattice fin, the superlattice fin comprising:
   a first plurality of nanosheets composed of a first semiconductor material;
   a second plurality of nanosheets composed of a second semiconductor material, the second semiconductor material being different from the first semiconductor material, wherein a width of a first nanosheet in the first plurality of nanosheets differs from a width of a second nanosheet in the second plurality of nanosheets, the second nanosheet being adjacent to the first nanosheet; and
   a gate structure surrounding three sides of the superlattice fin.

2. The semiconductor device of claim 1, wherein:
   the first semiconductor material comprises silicon germanium (SiGe); and
   the second semiconductor material comprises silicon (Si).

3. The semiconductor device of claim 2, wherein:
   the at least one superlattice fin is part of an n-type field-effect transistor (NFET); and
   the width of the second nanosheet is less than the width of the first nanosheet.

4. The semiconductor device of claim 3, wherein:
   the second nanosheet is disposed above and adjacent to the first nanosheet;
   a third nanosheet in the first plurality of nanosheets is disposed above and adjacent to the second nanosheet;
   a fourth nanosheet in the second plurality of nanosheets is disposed above and adjacent to the third nanosheet; and
   a width of the fourth nanosheet is less than a width of the third nanosheet.

5. The semiconductor device of claim 4, wherein the width of the first nanosheet is substantially the same as the width of the third nanosheet and wherein the width of the second nanosheet is substantially the same as the width of the fourth nanosheet.

6. The semiconductor device of claim 4, wherein the width of the third nanosheet is less than the width of the second nanosheet.

7. The semiconductor device of claim 2, wherein:
the at least one superlattice fin is part of a p-type field-effect transistor (PFET); and
the width of the second nanosheet is greater than a width of the first nanosheet.

8. The semiconductor device of claim 7, wherein:
the second nanosheet is disposed above and adjacent to the first nanosheet;
a third nanosheet in the first plurality of nanosheets is disposed above the second nanosheet;
a fourth nanosheet in the second plurality of nanosheets is disposed above and adjacent to the third nanosheet; and
a width of the fourth nanosheet is greater than a width of the third nanosheet.

9. The semiconductor device of claim 8, wherein the width of the first nanosheet is substantially the same as the width of the third nanosheet and wherein the width of the second nanosheet is substantially the same as the width of the fourth nanosheet.

10. The semiconductor device of claim 8, wherein the width of the third nanosheet is greater than the width of the second nanosheet.

11. The semiconductor device of claim 7, wherein the width of the first nanosheet is at least 0.37 times the width of the second nanosheet, but less than the width of the second nanosheet.

12. The semiconductor device of claim 1, wherein the semiconductor device comprises a gate-all-around (GAA) semiconductor device having a plurality of core GAA transistors and wherein the at least one superlattice fin structure is part of an input/output (I/O) transistor for the GAA semiconductor device.

13. The semiconductor device of claim 1, wherein widths of nanosheets in the first plurality of nanosheets are substantially the same and wherein widths of nanosheets in the second plurality of nanosheets are substantially the same.

14. The semiconductor device of claim 1, further comprising a substrate disposed beneath the first and second pluralities of nanosheets, wherein widths of nanosheets in the first plurality of nanosheets and in the second plurality of nanosheets increase with distance away from the substrate.

15. The semiconductor device of claim 1, further comprising a substrate disposed beneath the first and second pluralities of nanosheets, wherein widths of nanosheets in at least one of the first plurality of nanosheets or the second plurality of nanosheets decrease with distance away from the substrate.

16. The semiconductor device of claim 1, wherein an effective resistance of the first nanosheet in the first plurality of nanosheets is substantially the same as an effective resistance of the second nanosheet in the second plurality of nanosheets.

17. The semiconductor device of claim 1, wherein:
the at least one superlattice fin comprises a first superlattice fin and a second superlattice fin;
the first superlattice fin is part of an n-type field-effect transistor (NFET);
the second superlattice fin is part of a p-type field-effect transistor (PFET);
the first plurality of nanosheets in the first superlattice fin have a greater width than the second plurality of nanosheets in the first superlattice fin; and
the first plurality of nanosheets in the second superlattice fin have a smaller width than the second plurality of nanosheets in the second superlattice fin.

18. The semiconductor device of claim 16, wherein the effective resistance of the first nanosheet in the first plurality of nanosheets being substantially the same as the effective resistance of the second nanosheet in the second plurality of nanosheets is based on the difference between the width of the first nanosheet in the first plurality of nanosheets and the width of the second nanosheet in the second plurality of nanosheets.

19. A method for fabricating a semiconductor device, comprising:
forming at least one superlattice fin having a first plurality of nanosheets composed of a first semiconductor material and a second plurality of nanosheets composed of a second semiconductor material, the second semiconductor material being different from the first semiconductor material, wherein a width of a first nanosheet in the first plurality of nanosheets differs from a width of a second nanosheet in the second plurality of nanosheets, the second nanosheet being adjacent to the first nanosheet; and
forming a gate structure surrounding three sides of the superlattice fin.

20. The method of claim 19, wherein the forming comprises selectively etching at least one of the first semiconductor material or the second semiconductor material, such that the width of the first nanosheet differs from the width of the second nanosheet.

* * * * *